United States Patent
Ulyashin et al.

(10) Patent No.: US 6,806,171 B1
(45) Date of Patent: Oct. 19, 2004

(54) METHOD OF PRODUCING A THIN LAYER OF CRYSTALLINE MATERIAL

(75) Inventors: Alexander Ulyashin, Hagen (DE); Alexander Usenko, Murray Hill, NJ (US)

(73) Assignee: Silicon Wafer Technologies, Inc., Newark, NJ (US)

(*) Notice: Subject to any disclaimer, the term of this patent is extended or adjusted under 35 U.S.C. 154(b) by 0 days.

(21) Appl. No.: 10/213,593

(22) Filed: Aug. 7, 2002

Related U.S. Application Data

(60) Provisional application No. 60/314,623, filed on Aug. 24, 2001.

(51) Int. Cl.[7] .............................................. H01L 21/20
(52) U.S. Cl. ...................... 438/492; 438/466; 438/960
(58) Field of Search .......................... 438/FOR 330, 438/492, 466, 960; 257/E21.485

(56) References Cited

U.S. PATENT DOCUMENTS

| | | |
|---|---|---|
| 5,374,564 A | 12/1994 | Bruel |
| 6,221,738 B1 | 4/2001 | Sakaguchi |
| 6,352,909 B1 | 3/2002 | Usenko |

*Primary Examiner*—George Fourson

(57) ABSTRACT

A technique for forming a film of crystalline material, preferably silicon. The technique creates a sandwich structure with a weakened region at a selected depth underneath the surface. The weakened region is a layer of porous silicon with high porosity. The high porosity enclosed layer is formed by (1) forming a porous silicon layer with low porosity on surface of the substrate, (2) epitaxial growth of a non-porous layer over the low-porous layer (3) increasing of porosity of the low-porous layer making the said layer hi-porous, (4) cleaving the semiconductor substrate at said high porous layer. The porosity of the buried low-porous layer is increased by hydrogenation techniques, for example, by processing in hydrogen plasma. The process is preferentially used to produce silicon-on-insulator wafers.

6 Claims, 10 Drawing Sheets

METHOD OF PRODUCING A THIN LAYER OF CRYSTALLINE MATERIAL

STATEMENT OF RELATED CASES

This application claims priority of provisional patent application Ser. No. 60/314,623, filed Aug. 24, 2001 and entitled "Method of Producing a Thin Layer of Crystalline Material", which is incorporated by reference herein.

FIELD OF THE INVENTION

The present invention relates generally to methods of producing thin crystalline films. More particularly, the present invention relates to fabrication methods for silicon-on-insulator wafers.

BACKGROUND OF THE INVENTION

In previous art several methods of producing thin crystalline films are known:
(a) polishing (mechanical or chemical-mechanical) to thin an initial substrate
(b) time-controlled etchback to thin an initial substrate,
(c) etch-stop layer controlled etchback to thin an initial substrate,
(d) epitaxial lift-off of a layer from an initial substrate,
(e) separation by implanted oxygen (SIMOX)
(f) epitaxial layer transfer Eltran™, and its versions (Fipos etc.),
(g) layer transfer using hydrogen implantation (Smart-cut™ and its versions—Genesis™, Smarter-cut, etc.)
(h) layer transfer using hydrogen mesotaxy Polishing allows thinning a final substrate that is several times thinner than an initial substrate. This method is not applicable to obtain a thin film 102 (few microns or less) from initial substrate 101, or thinning of initial substrate by several orders of magnitude. Polishing down is limited by the increasing non-uniformity in thickness 103 of the thinned substrate 102 FIG. 1.

The usefulness of the time-controlled etchback of an initial substrate 201 is also limited by increasing of the non-uniformity 203 of final thinned substrate 202 with etching FIG. 2.

Etch-stop-layer 302 controlled etchback allows getting final thinned layers 303 that are uniform in thickness, and can be 2 to 3 orders of magnitude thinner than an initial substrate, and also allows to get final thin crystalline films 303. In crystal silicon a typical etch stop layer is heavily boron-doped layer. However, the etched part 301 of the initial substrate is sacrificed, FIG. 3.

An epitaxial lift-off does not allow slicing or grafting of crystalline layers with an area bigger than about 1 square inch. For silicon technology, a standard diameter of wafer 402 is 200 to 300 mm, and therefore the epitaxial lift-off cannot be used. An etchant in the epitaxial lift-off approaches a sacrificial layer 403 from the periphery of the sacrificial layer. With etching, a periphery of the layer to be lifted-off 401 begins to release. If the released part of the layer 401 to be lifted-off self-bends upward, then a penetration path for a fresh etchant appears, and the etchant continues to etch along the plane of the sacrificial layer. With increasing of lift-off area, either the etch rate becomes too slow or the released part of a layer 401 breaks off FIG. 4.

SIMOX is a method making of silicon-on-insulator wafers. It can be also considered as a method of thinning of crystalline silicon wafers where the layer is separated from an initial substrate by forming a silicon dioxide layer inside of the silicon substrate. The separation layer is formed by implantation of oxygen ions into the substrate and subsequent internal oxidation of silicon. The thinned silicon film is not free standing but is affixed to the parent substrate and is separated from the substrate with the built-in $SiO_2$ film. Disadvantage is that the SIMOX is expensive due to the high implantation dose needed (about $10^{18}$ $cm^{-2}$). Also, the wafer size is limited to 200 mm because of wafer bow during the high temperature (about 1350° C.) step required for internal oxidation.

Next, more advanced thinning techniques, ELTRAN and Smart-cut, also produce layers that are too thin to handle conveniently. Therefore, those techniques involve a step of placing and affixing of the layer onto a handle substrate. This step is usually called "wafer bonding". Therefore those techniques are also called as layer transfer techniques, meaning that the layer is cut from a first (donor or parent) substrate and affixed to a second (handle or support) substrate. The ELTRAN and Smart-cut were initially developed in silicon technology, so they are also referred as methods of making of silicon-on-insulator wafers.

In the ELTRAN process (T. Yonehara, K. Sakaguchi, N. Sato, "Epitaxial Layer Transfer by Bond and Etch Back of Porous Si," Appl. Phys. Lett., Vol. 64, p. 2108, 1994). FIG. 5, a porous silicon layer 502 is first formed on a surface of a silicon crystalline substrate 501. Next an epitaxial layer 503 is grown on surface of the porous silicon 502. The epitaxial layer 503 covers pores, and after exceeding a certain thickness a non-porous layer grows under continuing epitaxy. A support (typically, oxidized) wafer 504 is bonded to a surface of the epitaxially grown layer 503. The bonded assembly is than separated along the porous silicon layer using a water jet. The thin layer 503 is formed and affixed to a handle wafer 504. However, the crystalline quality of the epitaxial layer grown on a surface of the porous layer is limited. The quality of epitaxially grown layer degrades with an increasing of initial porosity. On the other hand, the essential step of cleaving along the plane of the porous layer requires that the porous layer have high porosity, typically over 70%. The ELTRAN does not allow getting high crystalline quality of the layer.

Numerical attempts were made to improve the quality of ELTRAN epitaxial film by forming a high porosity sublayer underneath of a low porosity sublayer. Those approaches include either ion implanting before anodic etching (Sakaguchi, U.S. Pat. No. 6,221,738) or increasing of anodic current before the end of anodization (C. S. Solanki, R. R. Bilyalov, H. Bender, J. Poortmans, "New Approach for the formation and separation of a Thin Porous Silicon Layer", Physica Status Solidi A, vol. 182, pp.97–101, 2000). At the beginning of the process the current has a low value and low porosity silicon is formed. After reaching a desirable depth, the current is increased, and porosity of silicon increases. However, those approaches are often non-repeatable.

In previous art, there is also known a method of producing a thin layer of crystalline material taught by Bruel (U.S. Pat. No. 5,374,564). This method also called Smart-cut™ is detailed in FIG. 6. In this process, an initial crystalline substrate 601 is implanted with hydrogen that collects in a layer 603 and constitutes a thin layer 604. The substrate 601 is bonded along an interface 605 to another substrate 602 and then cleaved along the hydrogen rich layer 603. The method of Bruel allows obtaining very thin and uniform layers 604. However, the process is expensive because of the required high implantation dose ($5 \times 10^{16}$ $cm^{-2}$) of hydrogen performed at low ion current. Another disadvantage is that a range of a thickness of the layers is limited from about 0.4 to about 1.5 microns.

In previous art, there is also known a layer transfer method by growing of an enclosed thin layer of hydrogen platelets within a silicon substrate (Usenko, U.S. Pat. No. 6,352,909). Due to the method a buried layer of defects is formed in a silicon wafer, then hydrogen is diffused into the wafer. The hydrogen get trapped onto the defects, and then the hydrogen-rich layer rearranges into a layer of hydrogen platelets under proper thermal trajectory during the hydrogenation. Further hydrogen diffusion into the wafer causes gettering of hydrogen onto the newly formed platelets (hydrogen mesotaxy) and the platelets grow in size. A stress distribution inside the substrate enhances growth of the platelets along the plane along the initial layer of defects. Finally a platelet-rich layer is formed that is fragile enough permit cleaving of the substrate along the hydrogen platelet layer. Hydrogen is diffused into silicon from either a hydrogen plasma or from electrolyte. This method keeps advantages of Smart-cut concerning a crystalline quality of the final layer. An advantage over Smart-cut™ is that the Usenko method does not require an expensive high implantation dose at low implant rate. However, this method allows making only extremely thin crystalline layers with typical thickness of about 0.1 micron. An implantation depth of heavy ions used to form the defect layer originates the thickness limit.

Uniform and high crystalline quality layers with thickness in a range of 1 to 10 microns are needed in many applications like MEMS (microelectromechnical systems). SIMOX, Smart-cut, and their versions require an additional step of epitaxial grow on an initial thinned layer to get the required thickness. An epitaxial growth allows getting high quality layers if the process is performed at high temperature (about 1200° C.). High temperature processing of a layered structure like silicon-on-insulator results in the wafer bow and cracks because of thermal mismatch between layers of the structure.

It would be beneficial to the art to have an inexpensive method of fabricating of crystalline layers to with a thickness in a range of 0.1 to 10 microns and with high crystalline quality.

SUMMARY OF THE INVENTION

A method in accordance with the present invention provides producing of thin crystalline layers.

The crystalline slices are fabricated by:

Forming a porous silicon layer with low porosity

Epitaxial growth of a non-porous layer over the low-porous layer

Increasing the porosity of the low-porous layer making the said layer highly porous Separating the layer from the semiconductor substrate by cleaving the semiconductor substrate along said highly porous layer Flattening a surface of said separated layer.

The process is preferentially used to slice silicon layers from a silicon substrate.

After a step of epitaxial growth of non-porous silicon on top of the low-porous silicon the resulting structure includes a buried low-porous silicon layer.

The porosity of the buried low-porous layer is increased during a step of hydrogenation. The hydrogenation comprises immersing the wafer into an environment containing a high concentration of monatomic hydrogen. Hydrogen DC plasma and hydrogen RF plasma are suitable hydrogenation sources. Electrolytic hydrogenation may also be used.

Before said separating step the substrate can be bonded to a second substrate. In this case a layer is transferred from one substrate to another substrate. Substrates are preferably silicon wafers. If at least one of wafers is oxidized before said bonding, the process results in silicon-on-insulator wafer and a remaining wafer for reuse in the slicing process.

DETAILED DESCRIPTION

Figure 1:
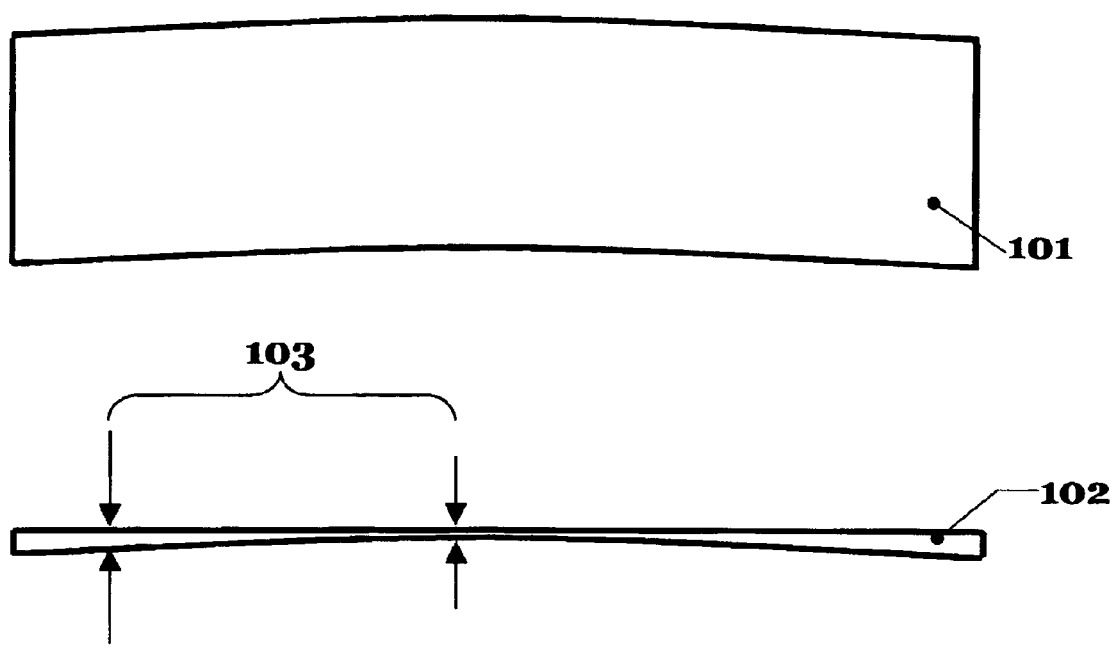
FIG. 1 depict a substrate before and after a conventional polishing process.
Figure 2:
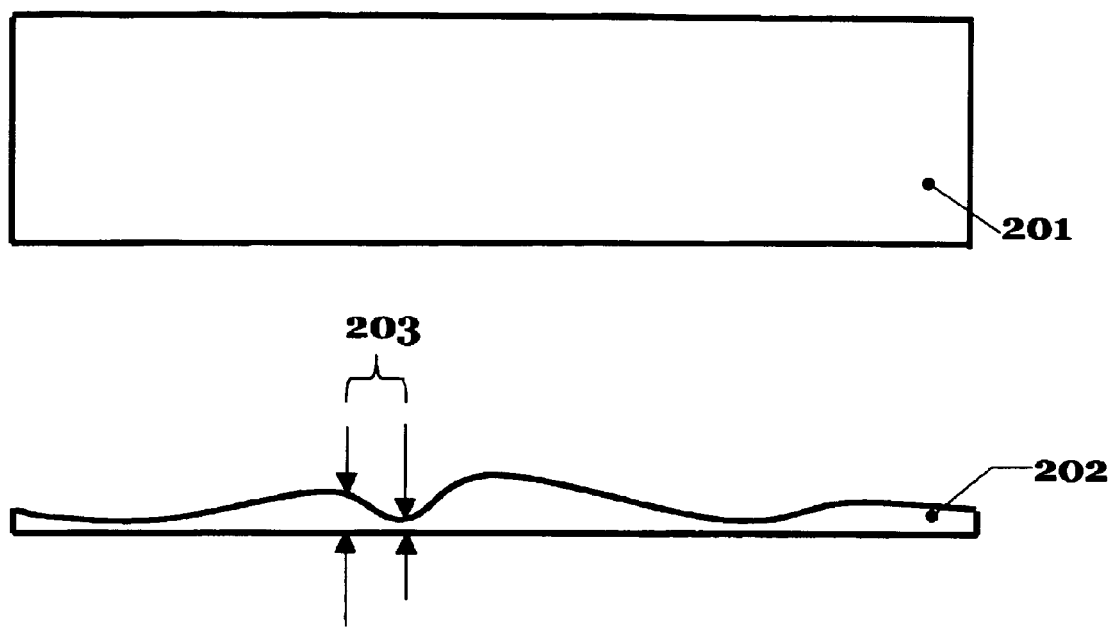
FIG. 2 depicts a substrate before and after a conventional time-controlled etchback process.
Figure 3:
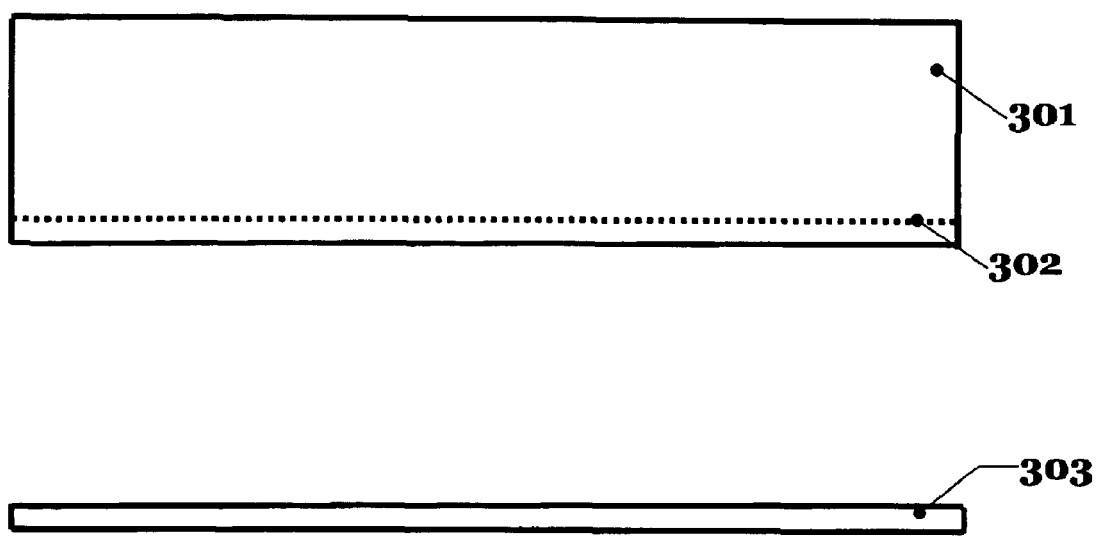
FIG. 3 depicts a substrate before and after a conventional stop-layer controlled etchback process.
Figure 4:
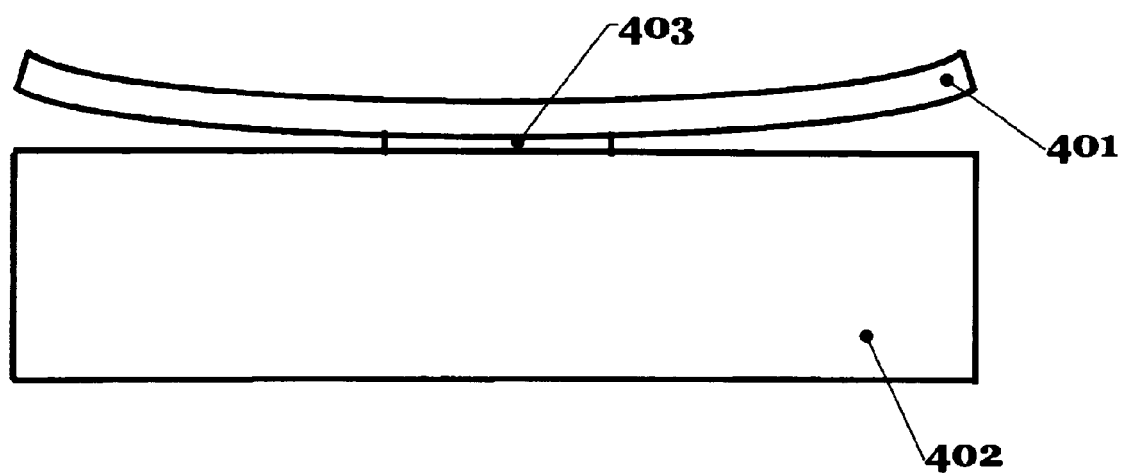
FIG. 4 illustrates a conventional epitaxial lift-of process.
Figure 5:
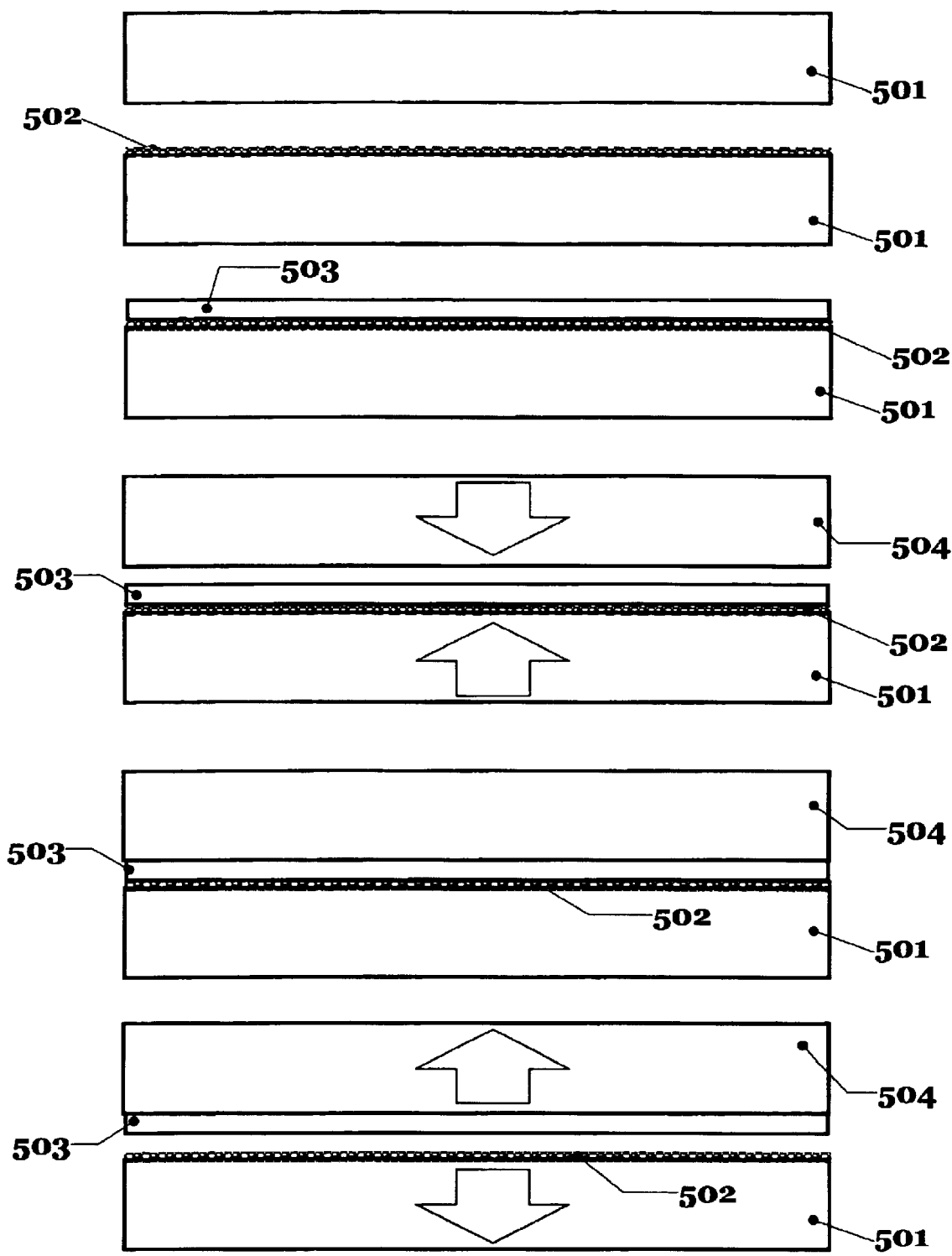
FIG. 5 depicts a flow diagram of a method of producing of thin crystalline layer in accordance with the conventional ELTRAN process.
Figure 6:
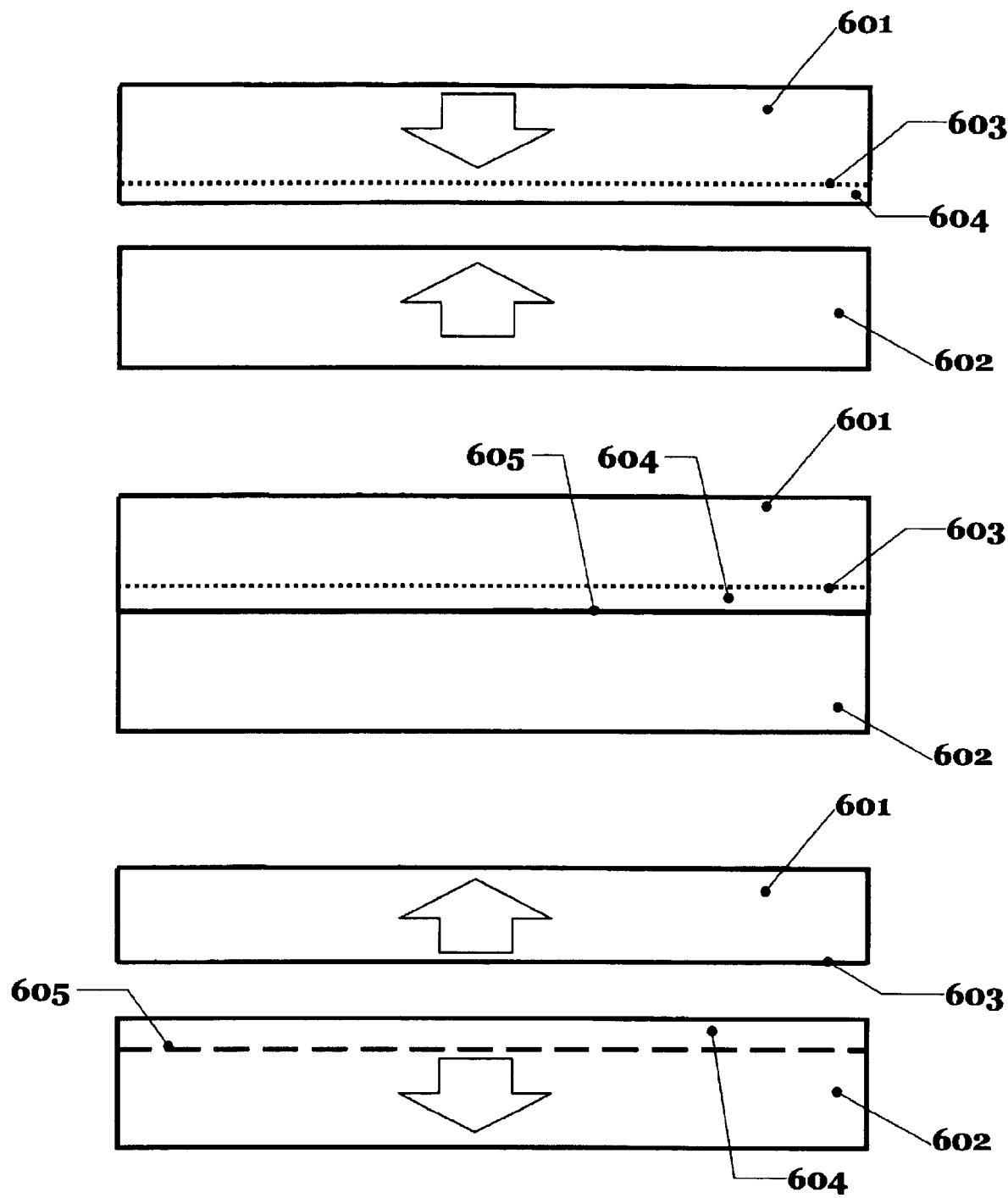
FIG. 6 depicts a flow diagram of a method of producing of a thin crystalline layer in accordance with the conventional Smart-cut process.
Figure 7:
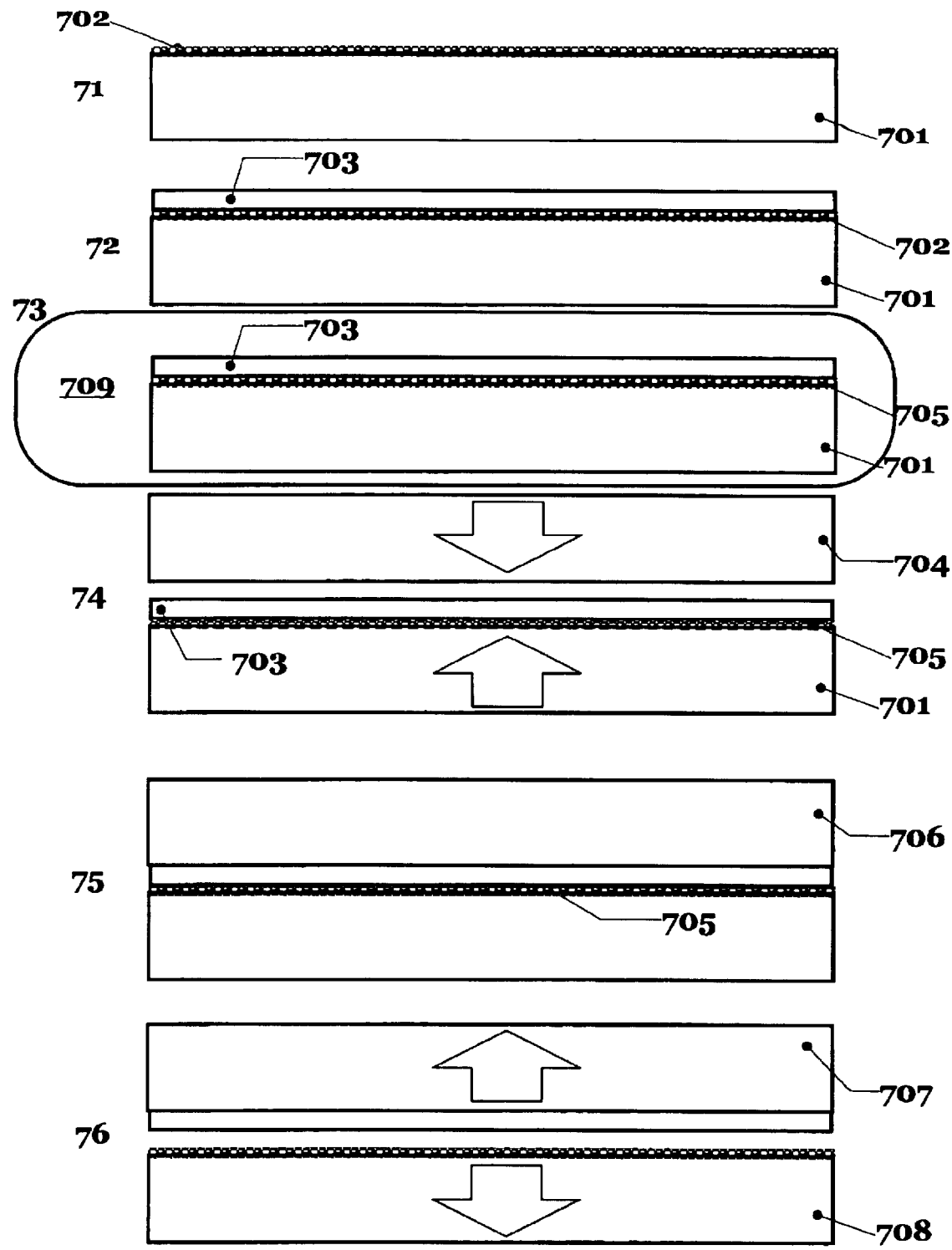
FIG. 7 depicts a flow diagram of a method in accordance with the illustrated embodiment of the present invention.

In accordance with the present teachings, silicon-on-insulator wafers are fabricated via a method that includes producing a thin layer of a crystalline material. FIG. 7 depicts a flow diagram of a method in accordance with the illustrated embodiment of the present invention.

According to operation 71 of illustrative method a porous silicon layer with low porosity 702 is formed on a surface of an initial silicon wafer 701. Standard silicon 150 or 200 mm diameter p-type boron doped 0.01 to 10 Ohm×cm wafers are processed by electrochemical process in a Teflon cell in an electrolyte containing a hydrofluoric (HF) acid. For thick (several micrometers) layer transfer, n-type silicon wafers can also be used. All the properties of porous silicon, such as porosity, thickness, pore diameter and microstructure, depend on anodization conditions. These conditions include HF concentration, current density, wafer type and resistivity, anodization duration, illumination (n-type mainly), temperature, and drying conditions (see Table 1). Choosing proper conditions to get a desired porosity and pore size is described in previous art, for example "Porous silicon: a quantum sponge structure for silicon based optoelectronics" by O. Bisi, S. Ossicini, L. Pavesi, Surface Science Reports, vol.38 (2000) pp.1–126; also "Porous silicon: a review of the technology and potential markets for an emerging material: a report" by Technical Insights, Inc., New York: Wiley, 2000.

Porosity is defined as the fraction of void within the porous silicon layer and can be easily determined by weight measurements. The wafer is weighted before anodization ($m_1$), just after anodization ($m_2$), and after a rapid dissolution of the whole porous layer in a 3% KOH solution ($m_3$). The porosity is given by the following equation:

$$P(\%) = \frac{(m_1 - m_2)}{(m_1 - m_3)}$$

Guessing the Si density ρ, one can also get the porous silicon layer thickness d $$d = \frac{m_1 - m_3}{\rho S}$$

where S is the etched surface. The mass of the wafer is given by $m_1$, $m_2$, and $m_3$ at the respective process steps.

Figure 10:
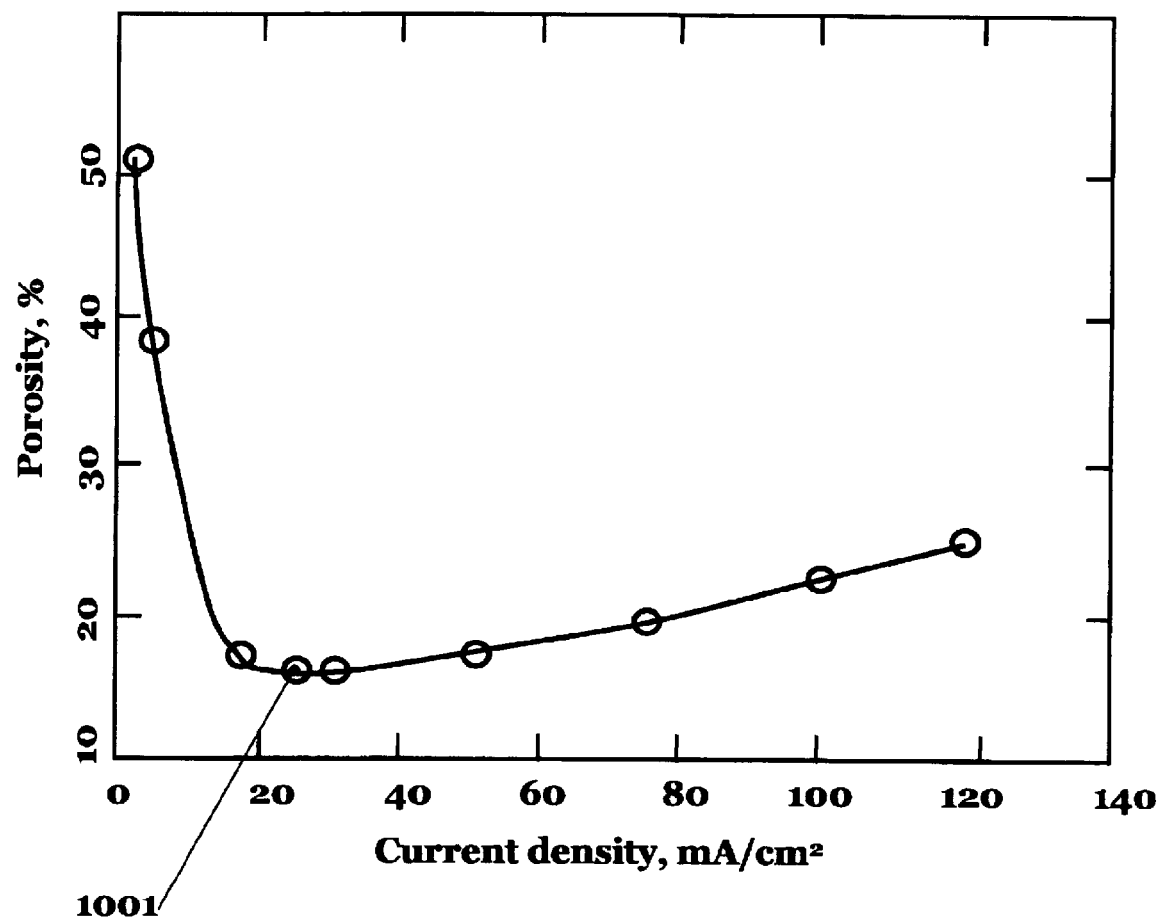
FIG. 10 shows porosity of silicon layer as a function of current densities for highly doped n-type silicon substrate.

For p-type doped substrates, and for a given HF concentration the resulting porosity increases with increasing current density. For a fixed current density, the porosity decreases with HF concentration. With fixed HF concentration and current density, the porosity increases with thickness and porosity gradients in depth occur. This happens because of the extra chemical dissolution of porous silicon layer in HF. The thicker the layer, the longer the anodization time, and the longer the residence of Si in the HF reaches solutions, the higher the mass of chemically dissolved porous silicon. This effect is much more important for lightly doped Si, while it is almost negligible for heavily doped Si, because of the lower specific surface area. For heavily n-type doped Si, the porosity as a function of current density is quite different from the obtained for p-type doped substrates. The porosity exhibits a sharp minimum 1001 around 20 mA/cm², as it is shown on FIG. 10. For higher current densities the behavior is similar to the p-type doped substrates, but for lower current densities the porosity increases sharply. This large increase in porosity is not explained simply by chemical dissolution (with given thickness, the lower the current density, the longer the anodization time), but it is due to a difference in microstructure of the porous region. In n-type doped Si, the layers obtained at low current density have a finer structure.

Thus the formation of porous silicon is selective with respect to the doping of the substrate. Heavily doped regions are etched faster than low doped regions when etched in the dark, n-type doped regions in p-type doped substrate are not attacked, controlled doping profiles result in controlled porous silicon formation. For p-type doped Si both pore size and inter-pore spacing are very small, typically between 1 and 5 nm, and the pore network looks very homogeneous and interconnected. As the dopant concentration increases, pore sizes and inter-pore spacing increase, while the specific surface area decreases. The structure becomes anisotropic, with long voids running perpendicular to the surface, very evident in highly p-type doped Si. For n-type doped Si the situation is more complicated. Generally, pores in n-type doped Si are much larger than in p-type doped Si, and pore size and inter-pore spacing decreases with increasing dopant concentrations. Lightly doped n-type substrates anodized in the dark have low porosity (1 ... 10%) with pores in the micrometer range. Under illumination higher values of porosity can be achieved, and mesopores are formed together with macropores. The final structure depends strongly on anodization conditions, especially on light intensity and current density. While highly n- and p-type doped Si show similar structures, in n-type doped Si pores form a randomly directed filamentary net and tend to "pipe" forming large straight channels approaching electropolishing regime. Both filaments and channels propagate only in the <100> direction.

TABLE 1

Effect of anodization parameters on porous silicon formation

| An increase of . . . yields a | Porosity | Etching rate | Critical current |
|---|---|---|---|
| HF concentration | Decreases | Decreases | Increases |
| Current density | Increases | Increases | — |
| Anodization time | Increases | Almost constant | — |
| Temperature | — | — | Increases |
| Wafer doping (p-type) | Decreases | Increases | Increases |
| Wafer doping (n-type) | Increases | Increases | — |

Figure 9:
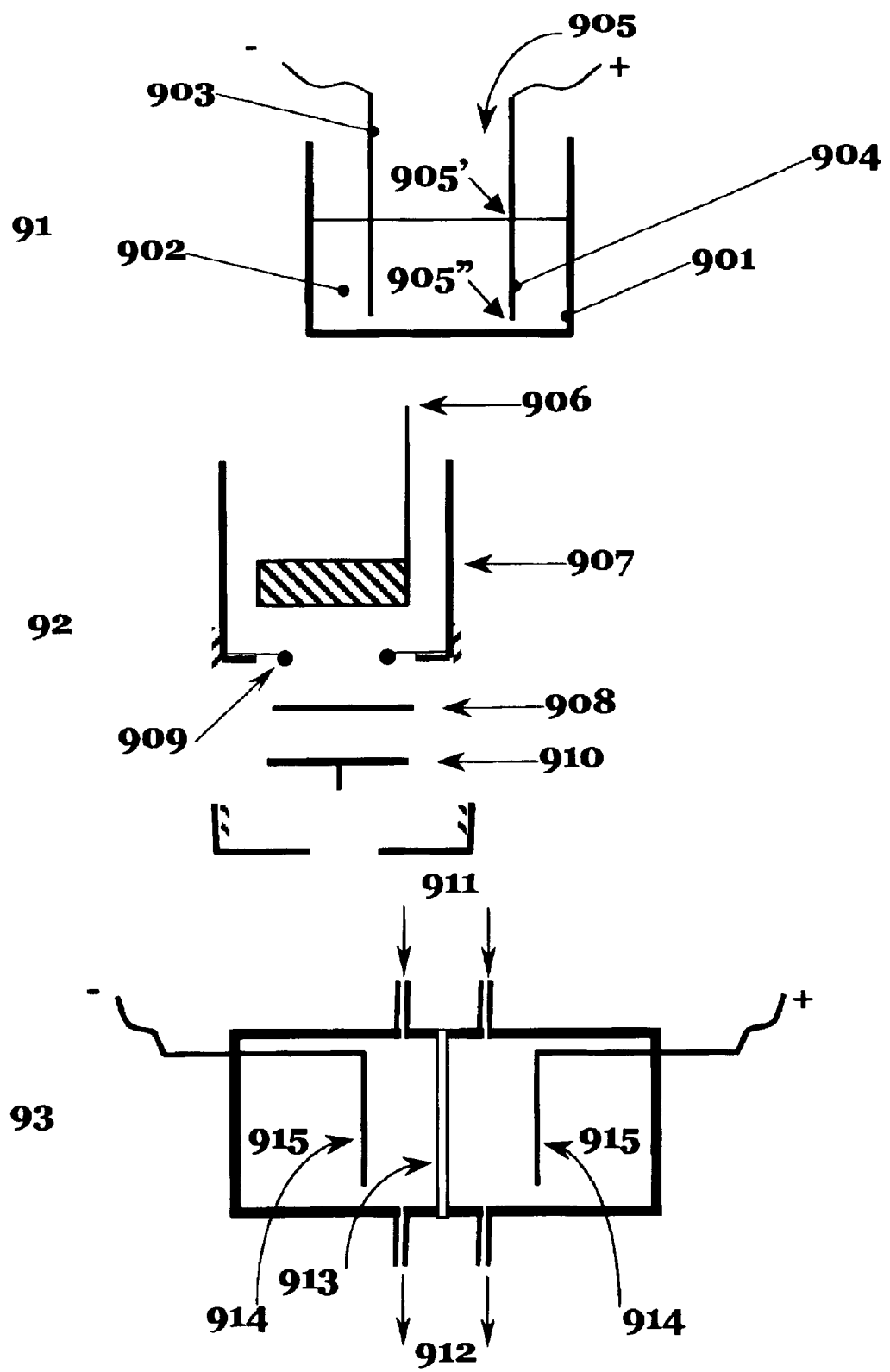
FIG. 9 depicts 3 types of electrochemical cells for fabricating a porous silicon layer.

The porous silicon layer on silicon wafer 904 is prepared using cell 91 FIG. 9 with platinum counterelectrode 903. The cell 91 consists of a container 901, filled with electrolyte 902, and connected to a current source supplying current 905. Due to the finite conductivity of the silicon wafer 904, current 905' is higher than current 905". It results in a gradient of thickness of the porous layer that is not desirable. To exclude the thickness variations, more advanced cell designs 92 and 93 can be used. The cell 92 has a body 907 with o-ring 909, and fitting 911 that is used to press a contacting electrode 910 against the wafer 908 and seal the reactor body 907. The reactor is than filled with an electrolyte, and graphite or platinum grid electrode 906 is immersed into the reactor 907. In a cell 93 the wafer 913 is electrically contacted through electrolyte 915 from both sides. Electrodes 914 are connected to a current source. The electrolyte 915 is kept at a constant concentration of ingredients by pumping in of fresh electrolyte through intake ports 911 and removing used electrolyte through drains 912.

To obtain high a quality epitaxial layer grown over the porous silicon layer the porosity of the porous silicon and pore size should be minimized. On the other hand, the porosity should be high enough to build up a mechanical stress that ensures preferential growth of the pores along the porous layer during the subsequent plasma hydrogenation step. Therefore the porosity should be kept in a range of 5 to 20% with pore sizes in range of 5 to 50 nm. The thickness of the porous layer should be minimized to reduce the roughness of the as-transferred layer. The thickness of the porous layer is limited from lower side by the size of pores. The porous silicon layer cannot have a thickness to diameter aspect ratio less then ~1. Typical aspect ratios are in a range of 1 to 3. Consequently, the preferable thicknesses of the porous silicon layer are in a range of 10 to 150 nm. One skilled in the art can choose the proper combination of the wafer resistivity, wafer conductivity type, electrolyte composition, current flow and other conditions to get the porous silicon layer with 5 to 20% porosity and 10 to 50 nm thickness using the known art as described, for example, in the above cited reviews by Bisi and by Technical Insights.

The wafers 701 FIG. 7 are then electrochemically etched in a solution of 50% ethanol/50% hydrofluoric acid (48 wt %) with current density 20 mA cm$^{-2}$ and rinsed afterward in deionized water. The etching time ranges from 5 sec to 1 min, thus resulting in layer thicknesses between about 10 and 50 nm. The films show a red-brown to yellowish color. Other electrolyte compositions can be properly chosen by one skilled in the art as described in the above cited reviews.

Next, according to operation 72 of illustrative method FIG. 7 a non-porous silicon layer 703 is epitaxially grown on a surface of the porous silicon layer 702. The layer was grown using chemical vapor deposition (CVD) from silane to a thickness of 5 micrometers, as it is described in previous art, for example, L. Vescan, "Low-Pressure Vapor-Phase Epitaxy of Silicon On Porous Silicon", Materials Letters, vol. 7, No. 3, September 1988, pp. 94–98, also C. Oules et al., "Silicon on Insulator Structures Obtained by Epitaxial Growth Of Silicon Over Porous Silicon", Journal of Electrochemical Society vol. 139, No. 11, November 1992, pp. 3595–3599. The pores in the porous silicon layer get sealed under epitaxy and the pores are evolved into cavities. A crystalline an electrical quality of the epitaxially grown layer have been examined using regular methods and it shows superior quality over the quality of epitaxial layers grown on surface of high porosity silicon.

Figure 8:
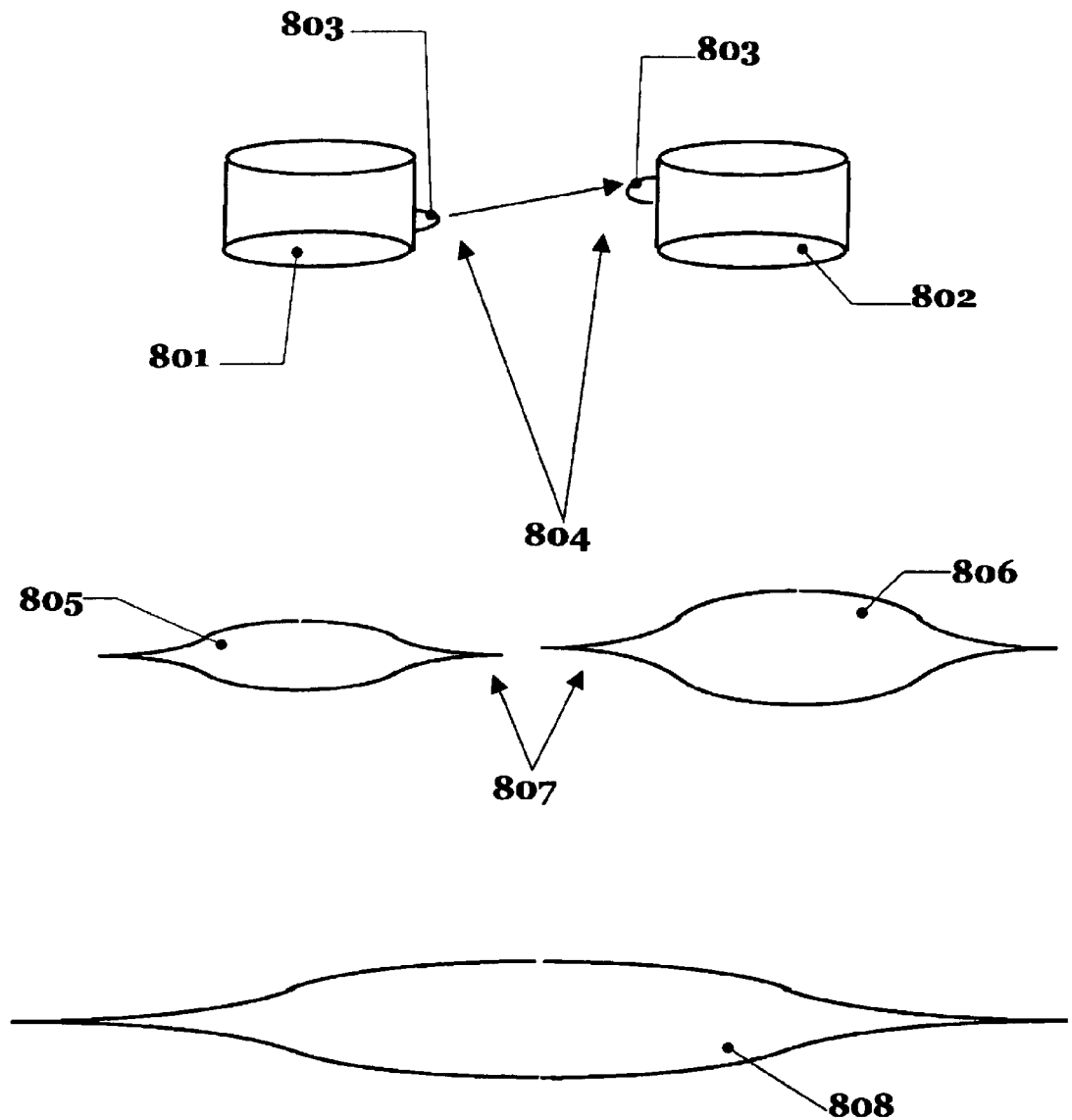
FIG. 8 illustrates growing platelets and bubbles during hydrogenation.

Next, according to operation 73 of illustrative method FIG. 7 the porosity of the layer 702 is increased with plasma hydrogenation in either DC plasma or in RF plasma under hydrogen pressure in the plasma chamber of 0.1 to 100 Torr, plasma excitation power applied of 100 to 500 Watts, temperature of substrate 100 to 450 C, and processing time 0.1 to 1 hour. The plasma is a source of monatomic hydrogen. The monatomic hydrogen diffuses through the crystalline silicon until it finds either an internal surface of a bubble or a lattice imperfection. Those sites usually work as traps for hydrogen. Hydrogen trapped on an internal surface of the cavity combines with another hydrogen atom making molecular hydrogen and leaving an open silicon bond on the internal surface of the cavity. This action restores the hydrogen trapping activity of the surface of the cavity wall and the cavity size grows. The shape and size of cavities change under hydrogenation. Cavity sizes tend to increase and shape changes from predominantly vertically-oriented 801, 802 FIG. 8 to predominantly flat 805, 806 and are oriented along the porous layer plane. The driving forces for the cavity evolution include both mechanical stress and hydrogen pressure inside of the cavities. During hydrogenation, hydrogen platelets 803 form on walls of porous silicon cavities 801, 802. With further hydrogenation, distances 804, 807 between neighboring cavities decrease. Under further hydrogenation, smaller cavities 805, 806 form bigger cavities 808. The platelet extensions of the pores nucleate if the wafer temperature under hydrogenation does not exceed 250° C. during about 1 hour. Hydrogenation in this condition allows getting an as-cleaved surface with a roughness that is about equal to a vertical size of initial pores of low-porosity layer 702. If hydrogenation is performed at temperatures exceeding 250° C., pores grow in all dimensions, but still mostly in horizontal direction. However, the increasing of process temperature to over 350° C. is not recommended. It results either in blistering of the silicon layer, or the pores do not grow in the required horizontal direction. As-cleaved surfaces of layers obtained after high temperature hydrogenation show a roughness, which is similar to as-cleaved surfaces obtained with low temperature hydrogenation. Therefore, the platelet-growth mode instead of the pore growth mode is preferable for producing of thin silicon layers about 1 micron thick. The pore growth mode requires shorter hydrogenation time of about 10 minutes, and it is preferable as a production process for producing thick layers (several microns). Under hydrogenation the low-porous layer 702 FIG. 7 is transformed into high porous layer 705.

Next, according to operation 74 of illustrative method FIG. 7 the wafer 701 with high porous layer 705 and non-porous epilayer 703 is pre-bonded to a handle wafer 704. The handle wafer 704 is preferably oxidized in order to obtain a final sandwich structure $Si/SiO_2/Si$ generally referred to as an SOI wafer. Alternatively, the Si/porous Si/epi-Si structure 701/705/703 is oxidized before the bonding step. However, the oxidation is usually prepared by heating in oxygen-containing atmosphere that tends to dissolve the cavities of the porous Si layer 705 thus decreasing its porosity, and is thus undesirable. The bonding process is performed in a regular way as described in previous art, for example, J. B. Lasky, "Wafer bonding for silicon-on-insulator technologies" Appl. Phys. Lett. Vol.48, p.76, 1986.

Next, according to operation 75 of illustrative method FIG. 7 the wafer assembly 706 is separated along the high porous layer 705 using a water jet. After the separating the structure 706 divides into silicon-on-insulator (SOI) wafer 707 and reusable leftover wafer 708. The separating technique is similar as it is used in the previous art, for example, K. Sakaguchi, K. Yanagita, H. Kurisa, H. Suzuki, K. Ohmi, T. Yonehara, "ELTRAN™ by Water-Jet Splitting in Stress-Controlled Porous Si, Proceedings of the IEEE International SOI Conference, 1999, pp.110–111.

Next, according to operation 76 of illustrative method FIG. 7 the SOI wafer 707 is postbonded and surface of transferred epilayer is smoothened. The finishing postbonding/smoothing operations are performed similarly as it is described in previous art, for example, in the above cited Bruel's patent and in the Sakaguchi paper.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. A method comprising:

forming a porous layer with low porosity on a single crystalline substrate growing the single-crystal layer on the surface of said porous layer then increasing of porosity of the said porous layer by hydrogenation of the substrate in hydrogen plasma separating said non-porous layer from said substrate by cleaving the wafer along the layer with increased porosity.

2. The method of claim 1 wherein said plasma processing comprises RF hydrogen plasma or DC hydrogen plasma.

3. The method of claim 2 wherein said plasma hydrogenation is performed at hydrogen platelet growth conditions.

4. The method of claim 3 wherein said plasma hydrogenation is performed at temperature 250° C. or less for a duration of at least 30 minutes.

5. The method of claim 2 wherein said plasma hydrogenation is performed to achieve pore growth conditions.

6. The method of claim 4 wherein said plasma hydrogenation is performed at temperature in a range 250° C. to 350° C. during at least 10 minutes.

* * * * *